US008990623B2

(12) United States Patent
Eaton et al.

(10) Patent No.: US 8,990,623 B2
(45) Date of Patent: Mar. 24, 2015

(54) AVOIDING BIST AND MBIST INTRUSION LOGIC IN CRITICAL TIMING PATHS

(75) Inventors: Craig D. Eaton, Austin, TX (US); Ganesh Venkataramanan, Sunnyvale, CA (US); Srikanth Arekapudi, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1012 days.

(21) Appl. No.: 12/948,702

(22) Filed: Nov. 17, 2010

(65) Prior Publication Data

US 2012/0124435 A1      May 17, 2012

(51) Int. Cl.
*G06F 11/27*      (2006.01)
*G01R 31/3185*    (2006.01)

(52) U.S. Cl.
CPC ........ *G06F 11/27* (2013.01); *G01R 31/318536* (2013.01)
USPC ................ 714/30; 714/27; 714/726; 714/727

(58) Field of Classification Search
USPC .......................... 714/726, 731, 27, 30, 32, 37
See application file for complete search history.

(56) References Cited

U.S. PATENT DOCUMENTS

| | | | |
|---|---|---|---|
| 4,860,290 A * | 8/1989 | Daniels et al. ................. | 714/726 |
| 6,748,519 B1 * | 6/2004 | Moore ........................... | 712/217 |
| 6,948,097 B2 * | 9/2005 | Hatakeyama ................... | 714/30 |
| 6,988,228 B2 * | 1/2006 | Paglieri .......................... | 714/726 |
| 7,539,915 B1 * | 5/2009 | Solt ................................ | 714/726 |
| 7,707,472 B1 * | 4/2010 | Dastidar ........................ | 714/733 |
| 2005/0283690 A1 * | 12/2005 | McLaurin ...................... | 714/726 |
| 2006/0012392 A1 * | 1/2006 | Rencher et al. ................. | 326/16 |
| 2009/0135961 A1 * | 5/2009 | Gemmeke et al. ............. | 375/340 |
| 2009/0193303 A1 * | 7/2009 | Giles et al. ..................... | 714/726 |

OTHER PUBLICATIONS

Wikipedia's Built-in Self-test version from Aug. 28, 2010 http://en.wikipedia.org/w/index.php?title=Built-in_self-test&oldid=381408156.*
Wikibooks' Microprocessor Design/Multi Cycle Processors version from May 1, 2007 http://en.wikibooks.org/w/index.php?title=Microprocessor_Design/Multi_Cycle_Processors&oldid=850205.*

* cited by examiner

*Primary Examiner* — Joseph Schell

(57) ABSTRACT

Methods, systems, and apparatuses are presented that remove BIST intrusion logic from critical timing paths of a microcircuit design without significant impact on testing. In one embodiment, BIST data is multiplexed with scan test data and serially clocked in through scan test cells for BIST testing. In another embodiment, BIST data is injected into the feedback path of one or more data latches. In a third embodiment, BIST data is injected into the result data path of a multi-cycle ALU within an execution unit. In each embodiment, BIST circuitry is eliminated from critical timing paths.

11 Claims, 6 Drawing Sheets

AVOIDING BIST AND MBIST INTRUSION LOGIC IN CRITICAL TIMING PATHS

BACKGROUND OF THE INVENTION

1. Field of the Invention

Generally, the present disclosure relates to integrated circuits, and, more particularly, to the design of Built-In Self-Test (BIST) circuits for testing components of a microcircuit design.

2. Description of the Related Art

Built-in self-test (BIST) is a technique that allows integrated circuits to test their own operation functionally and/or parametrically. Like other Design-for-Test (DFT) techniques, it makes difficult-to-test circuits easier to test by adding test circuitry to a microcircuit design for such things as test pattern generation, timing analysis, mode selection, and go-/no-go diagnostic tests. BIST includes control circuits to initiate tests and to collect and report the results, even externally to the chip.

BIST circuits often connect to scan logic. Scan logic is another DFT technique that facilitates testing of a microcircuit chip by, for example, replacing traditional sequential elements, such as flip flops, with scannable sequential elements, called scan cells. A scan cell is a traditional latch or flip-flop with an additional input called the scan input and an additional output called the scan output. The portion of the scan cell that comprises the traditional latch or flip-flop remains part of the functional core logic. The scan output of one scan cell, however, connects to the scan input of the next scan cell to form a scan chain. The scan chain allows test patterns to be serially injected into the core logic so that they appear at the outputs of the latches, or flops. Testing is accomplished by shifting test patterns into the scan chains, cycling the system clock one or more times, and capturing the test results within the latches or flops. The results may then be shifted out through the scan chain for analysis by external test equipment or internal BIST logic.

BIST circuits also typically connect to boundary-scan elements. Boundary-Scan (also known as the Joint Test Action Group (JTAG) standard, or IEEE 1149.1) adds boundary-scan cells to each pin on a microcircuit device so that test and control data can be injected into the microcircuit device, tests initiated, and the results shifted out, even when the microcircuit is encased in a package. Boundary-scan test circuits are frequently used to initiate BIST and to report BIST results through, for example, a JTAG interface.

BIST logic does not come without a cost, however. The logic added to a microcircuit design for BIST testing typically intrudes into the critical timing paths of functional signals. BIST logic typically causes functional signals to propagate through additional gates that couple BIST test data onto the functional data paths, reducing the maximum speed of the microcircuit's operation and increasing its power consumption. While BIST makes device testing more efficient, it typically degrades device performance.

SUMMARY OF EMBODIMENTS OF THE INVENTION

The apparatuses, systems, and methods in accordance with the embodiments of the present invention improve device performance while maintaining the effectiveness of BIST. The apparatuses, systems, and methods described herein achieve improved performance by removing BIST intrusion logic from critical timing paths. Functional data, i.e., signals that propagate through the core logic of a microcircuit design, no longer need to pass through additional circuitry for BIST.

One apparatus in accordance with an exemplary embodiment of the invention comprises a plurality of scan cells connected into one or more scan chains, wherein a scan data input of at least one scan cell is configured to receive built-in test data during BIST testing and scan test data during scan testing. The test data may be supplied through a multiplexer that multiplexes the BIST test data and scan test data onto the scan data input pin of the scan cell. The apparatus may be microprocessor having a memory array, such as a cache memory, and an execution unit.

The apparatus may further comprise a memory array having at least one global bitline coupled to functional logic, the functional logic having a functional data input, a functional data output, and a test data input, wherein the test data input is coupled to the functional data output through a bypass circuit, the functional logic configured to cause a signal to propagate from the functional data input to the functional data output without passing through the bypass circuit.

The microprocessor may further comprise at least one execution unit having at least one multi-cycle ALU, at least one single-cycle ALU, at least one physical register file (PRF), and a multiplexer configured to couple test data onto the result path of the multi-cycle ALU. Test data may be written into the PRF through the execution of an opcode in one of the ALUs.

One method in accordance with an exemplary embodiment of the invention comprises multiplexing BIST data with scan test data on a scan data input circuit of a scan cell and selecting between the scan test data and the BIST data during testing of the microcircuit. The method may further comprise providing test data on a test data input of a bypass circuit coupled to functional logic, the functional logic having a functional data input and a functional data output, the test data input being coupled to the functional data output through the bypass circuit, wherein the functional logic is configured to allow a signal on the functional data input to propagate to the functional data output without passing through logic comprising the bypass circuit. The bypass circuit may comprise a multiplexer having one input coupled to the test data input and another input coupled to a feedback signal representing the functional data output. The method may further include injecting a test pattern into a physical register file (PRF) of an execution unit through the result path of a multi-cycle ALU and executing an operation that results in a known pattern being written into the PRF.

In other embodiments, the apparatuses described above may be formed on semiconductor material and configured to operate in the manner described above, or they may be designed using a hardware descriptive language and stored on a computer readable storage device encoded with data that, when implemented in a manufacturing facility, adapts the manufacturing facility to create the apparatuses. Though described in the context of a microprocessor design, the invention may be used in any type of integrated circuit and is not therefore limited to a microprocessors.

BRIEF DESCRIPTION OF THE FIGURES

The disclosed subject matter will hereafter be described with reference to the accompanying drawings, wherein like reference numerals denote like elements, and.

Figure 1:
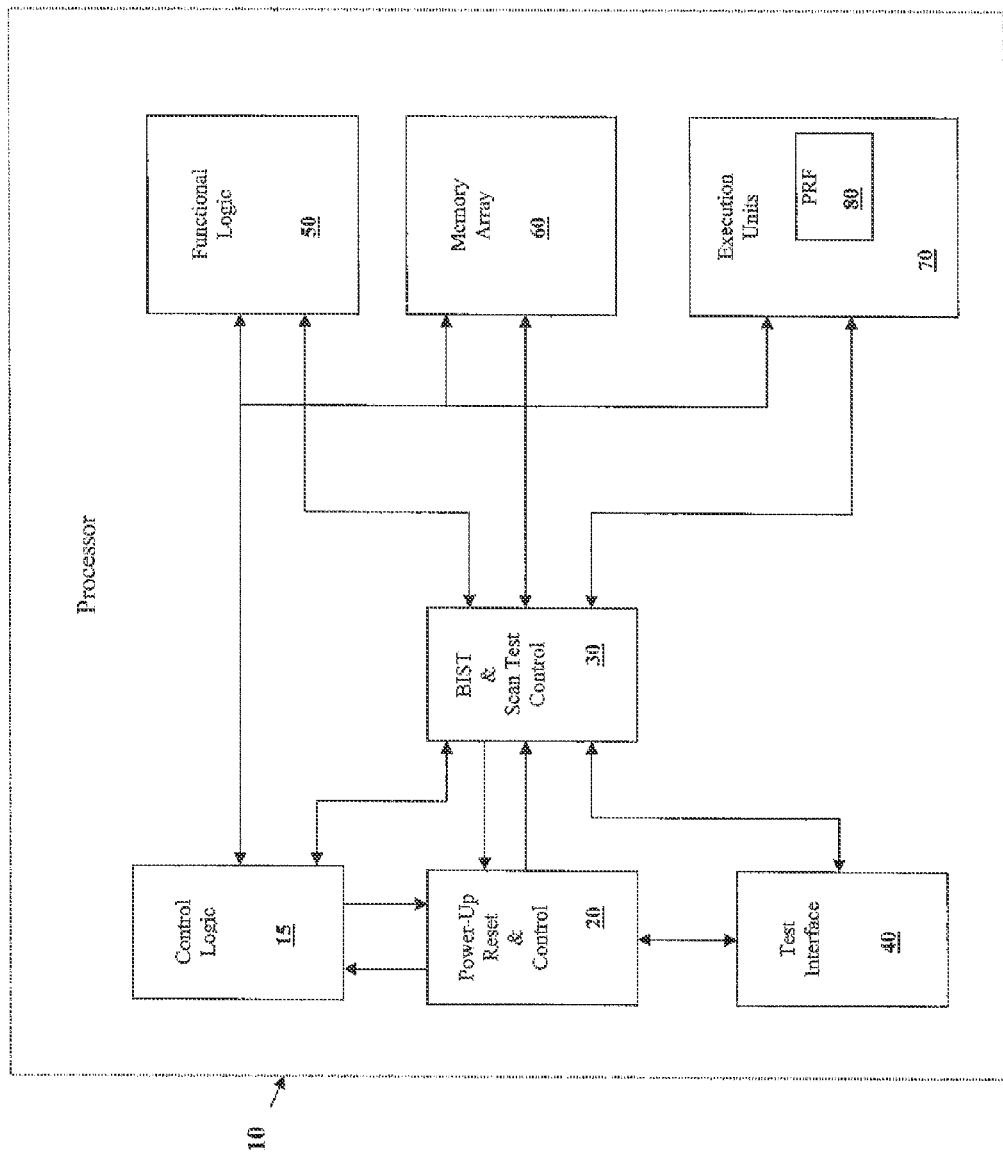
FIG. 1 is a simplified block diagram of a microprocessor design containing BIST and scan test elements in accordance with an exemplary embodiment of the invention.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

FIG. 1 is a simplified block diagram of a general purpose microprocessor 10 in accordance with an exemplary embodiment of the invention. Microprocessor 10 performs basic arithmetic operations, moves data from one memory location to another, and makes decisions based on the quantity of certain values contained in registers or memory. To accomplish these tasks, microprocessor 10 incorporates a number of execution units 70, such as a floating point unit or an integer execution unit, functional logic 50, and control logic 15. The functional logic 50, control logic 15, and execution units 70 may be designed, for example, using scannable sequential elements connected into one or more scan chains. Microprocessor 10 may also include one or more memory arrays 60, such as a cache memory and/or a translation look-aside buffer, to facilitate operation of the device. Microprocessor 10 also includes a type of memory array typically found in an execution unit 70, called a physical register file (PRF) 80. A PRF stores the intermediate results of an executed instruction, such as a floating point operation, for later use or storage in main memory.

For testing, microprocessor 10 contains BIST & Scan Test Control 30 circuitry for generating test patterns and/or shifting test patterns through scan chains that may comprise part of the functional logic 50, control logic 15, execution units 70, and memory arrays 60. Microprocessor 10 may include a Test Interface 40 that comprises, for example, a JTAG interface containing boundary scan elements, and/or a scan test interface for receiving test patterns and control data from scan test equipment external to the device. Test Interface 40 connects to Power-Up Reset & Control 20 to reset, configure, control, and/or initiate BIST and/or scan testing. Test patterns may be generated internally to microprocessor 10 by BIST & Scan Test Control 30 for BIST testing and injected into the core logic by shifting through the scan chains. The results may be shifted out and compared to expected results within BIST & Scan Test Control 30 or externally through Test Interface 40.

Figure 2:
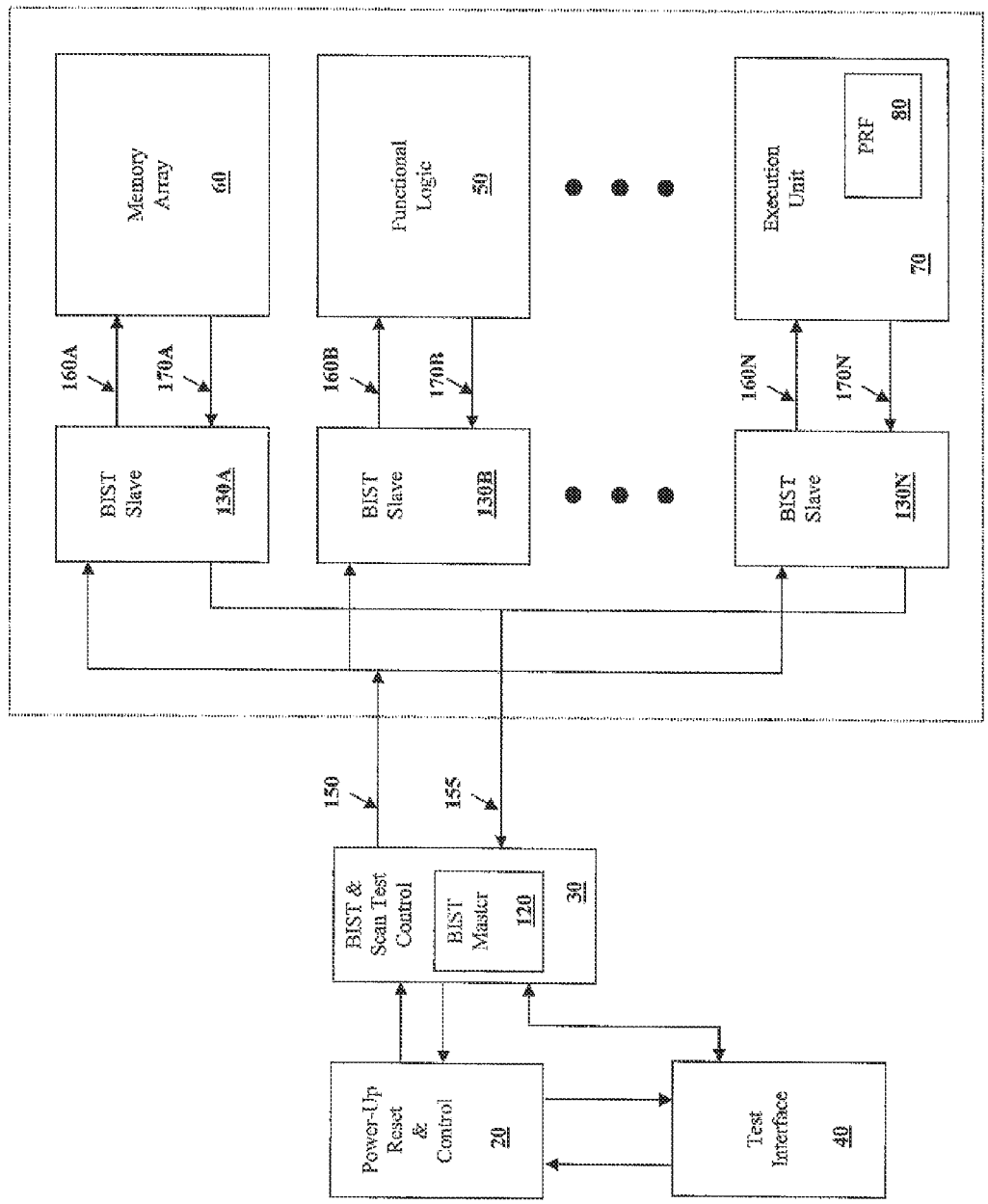
FIG. 2 is a simplified block diagram of a portion of the microcircuit design shown in FIG. 1 in accordance with an exemplary embodiment of the invention.

FIG. 2 is a simplified block diagram of a portion of the microcircuit design shown in FIG. 1. As shown, BIST & Scan Test Control 30 includes a master control unit 120 that connects to one or more slave units 130A, 130B, and 130N for communicating test patterns and/or control data, to initiate scan or BIST testing, and to collect and/or report the results. BIST & Scan Test Control 30 also connects to Power-Up Reset and Control 20 and Test Interface 40 to coordinate power-up reset testing, JTAG testing, and scan testing and report the test results, including, for example, to report a go/no-go diagnostic test result. Each slave unit controls the testing of one functional unit of microprocessor 10. As shown, slave unit 130A connects to memory array 60, 130B connects to functional logic 50, and 130N connects to execution unit 70. Each is designed specifically for testing a particular unit or collection of units.

Figure 3:
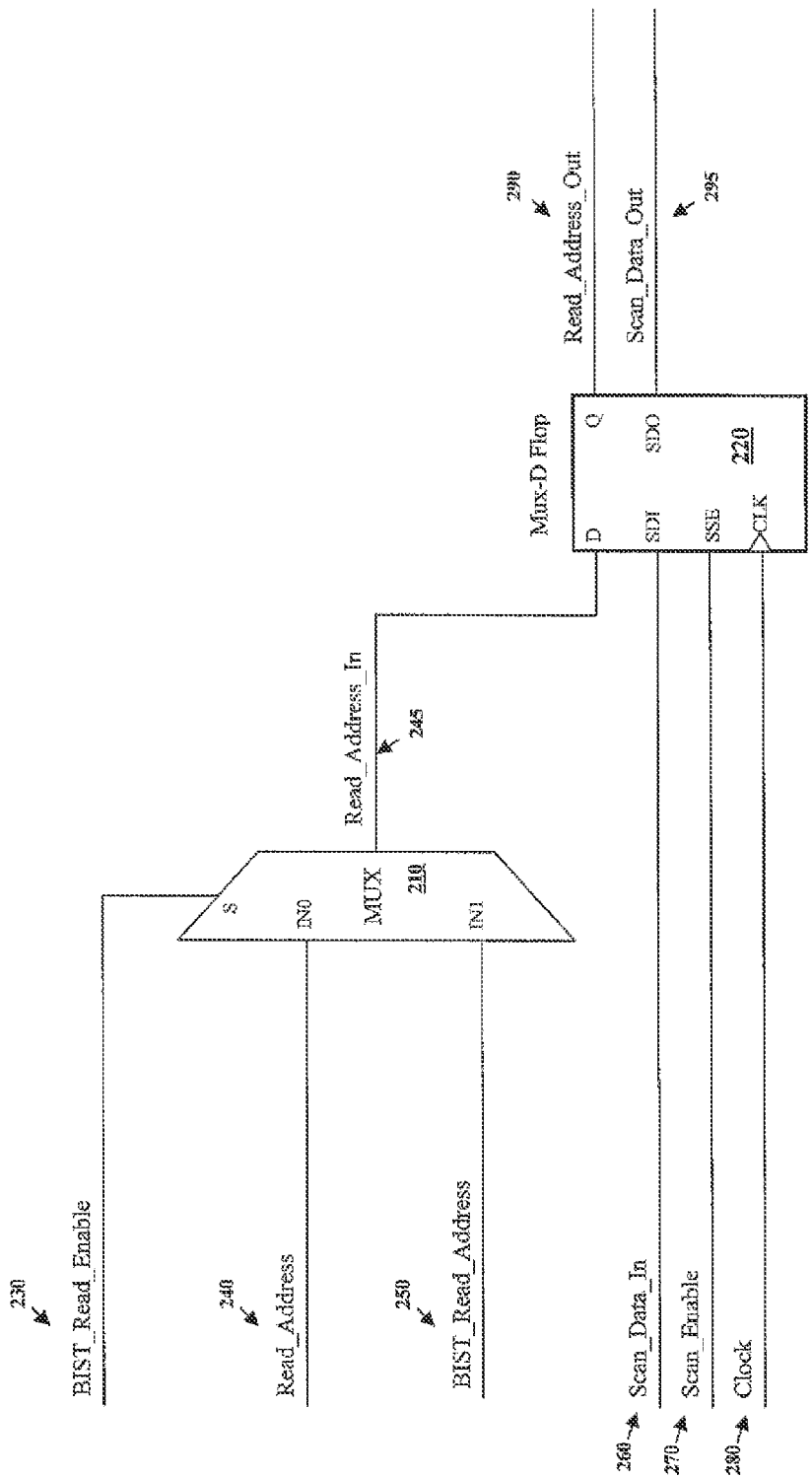
FIG. 3 is a simplified schematic diagram illustrating BIST intrusion logic in the critical timing path of an address line supplied to a memory array typically found in the prior art.

FIG. 3 is a simplified schematic diagram of a scan cell circuit comprising Mux-D flop 220, as typically found in the prior art. As understood by one of ordinary skill in the art, Mux-D flop 220 has two data inputs, Scan_Data_In 260 and Read_Address_In 245, and two data outputs, Read_Address_Out 290 and Scan_Data_Out 295. The next state of Read_Address_Out 290 and Scan_Data_Out 295 is determined by one of the two inputs. For example, if Scan_Enable 270 is high on the next rising edge of clock 280, Scan_Data_In 260 determines the next state of Read_Address_Out 290 and Scan_Data_Out 295. If Scan_Enable 270 is low on the next rising edge of clock 280, Read_Address_In 245 determines the next state of Read_Address_Out 290 and Scan_Data_Out 295. Clock 280 may be a system clock supplied internally by microprocessor 10 during the functional operation of microprocessor 10, a clock under the control of BIST & Scan Test Control 30, or supplied through Test Interface 40 during BIST or scan testing, or a clock generated and/or controlled by all three, depending on the design and operational state of microprocessor 10.

In a typical microprocessor design, there are many such scan cells connected into one or more scan chains. To form a scan chain, the scan output pin (SDO) of one scan cell is connected to the scan input pin (SDI) of the next. In the context of FIG. 3, the Scan_Data_In 260 signal of Mux-D flop 220 is typically connected to the scan data output pin of the previous scan cell, and the Scan_Data_Out 295 pin of Mux-D flop 220 is typically connected to the scan data input pin of the next scan cell. Scan chains facilitate shifting test patterns into and out of the core functional logic. By activating the scan enable pin of each scan cell of the scan chain (i.e., Scan_Enable 270, in the instant example) and cycling clock 280 until the entire test pattern has been serially shifted into the scan chain, the scan test pattern will appear on the outputs of the scan cells. Scan testing may then commence by deactivating the scan enable pin of each scan cell, enabling the functional data input pin of each scan cell to determine the next state of each scan cell's outputs, and cycling clock 280 the required number of times for the test. The results of the scan tests are captured inside the scan cells and may then be serially shifted out of the scan chain in the same manner the test pattern was serially shifted in. The test results may then be compared to expected results. In one embodiment, the comparisons for both scan and BIST testing may be done in slave units 130A, 130B, and 130N and the results reported to master unit 120. In other embodiments, the comparisons may be done in master unit 120 or in BIST & Scan Test Control 30 and report internally or externally, or shifted out through Test Interface 40 and compared externally to microprocessor 10.

As shown in FIG. 3, BIST data enters Mux-D flop 220 through multiplexer 210. In normal operation of microprocessor 10, both BIST_Read_Enable 230 and Scan_Enable 270 will remain inactive. This allows Read_Address line 240 to propagate through multiplexer 210 and determine the logical state of Read_Address_Out 290 on the next rising edge of clock 280. Read_Address 240 is an address line supplied by the core functional logic of microprocessor 10 during a memory read access cycle of memory array 60, for example. During Memory Built-In Self-Testing (MBIST), BIST Control 30 activates BIST_Read_Enable 230, sources BIST_Read_Address 250, and causes clock 280 to pulse one or more times. Multiplexer 210 acts as the insertion point for BIST data and constitutes BIST intrusion logic into the functional path of Read_Address 240. When BIST intrusion logic is inserted into critical timing paths like this, the maximum clocking frequency of the circuit is degraded and the constant cycling of the intrusion logic during normal functional operation of the microcircuit design consumes additional power. Removing BIST intrusion logic from critical timing paths increases the maximum speed of the microcircuit design and reduces normal power consumption.

Figure 4:
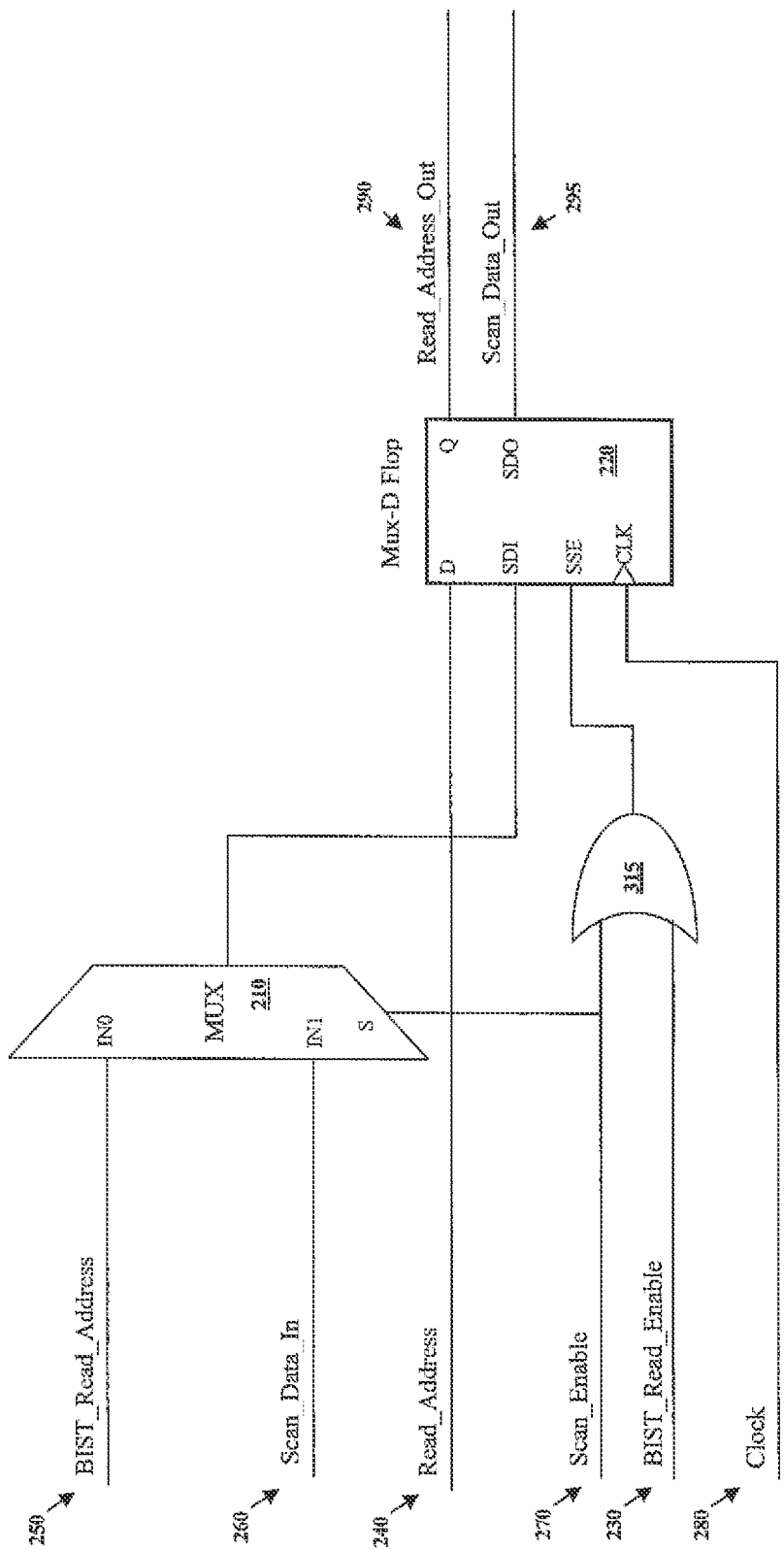
FIG. 4 is a simplified schematic diagram of the circuit of FIG. 3 configured in accordance with an exemplary embodiment of the invention.

FIG. 4 is a simplified schematic diagram of the circuit of FIG. 3 configured in accordance with an exemplary embodiment of the invention. In FIG. 4, multiplexer 210 multiplexes Scan_Data_In 260 with BIST_Read_Address 250, Read_Address 240 connects directly to the functional data input pin of Mux-D flop 220, and the output of multiplexer 210 connects to the scan input pin of the Mux-D flop 220 to select between scan test data and BIST data during testing of the microprocessor 10. Both BIST_Read_Enable 230 and Scan_Enable 270 select between the scan data input and functional data input of Mux-D flop 220 through OR gate 315. Because Read_Address 240 connects directly to Mux-D flop 220, Read_Address 240 no longer propagates through or cycles the logic contained in multiplexer 210 during normal microprocessor 10 operation, making the critical timing path of Read_Address 240 faster and more efficient.

Though FIG. 3 and FIG. 4 illustrate the effect of BIST intrusion logic on read address lines, any data or control line could have been selected. For example, the circuits illustrated in FIG. 3 and FIG. 4 may be used for any data or control line in control logic 15, functional logic 50, memory array 60, or execution unit 70 of microprocessor 10 where BIST and scan test data injection points are made. A read address line is shown for illustration purposes only.

Figure 5:
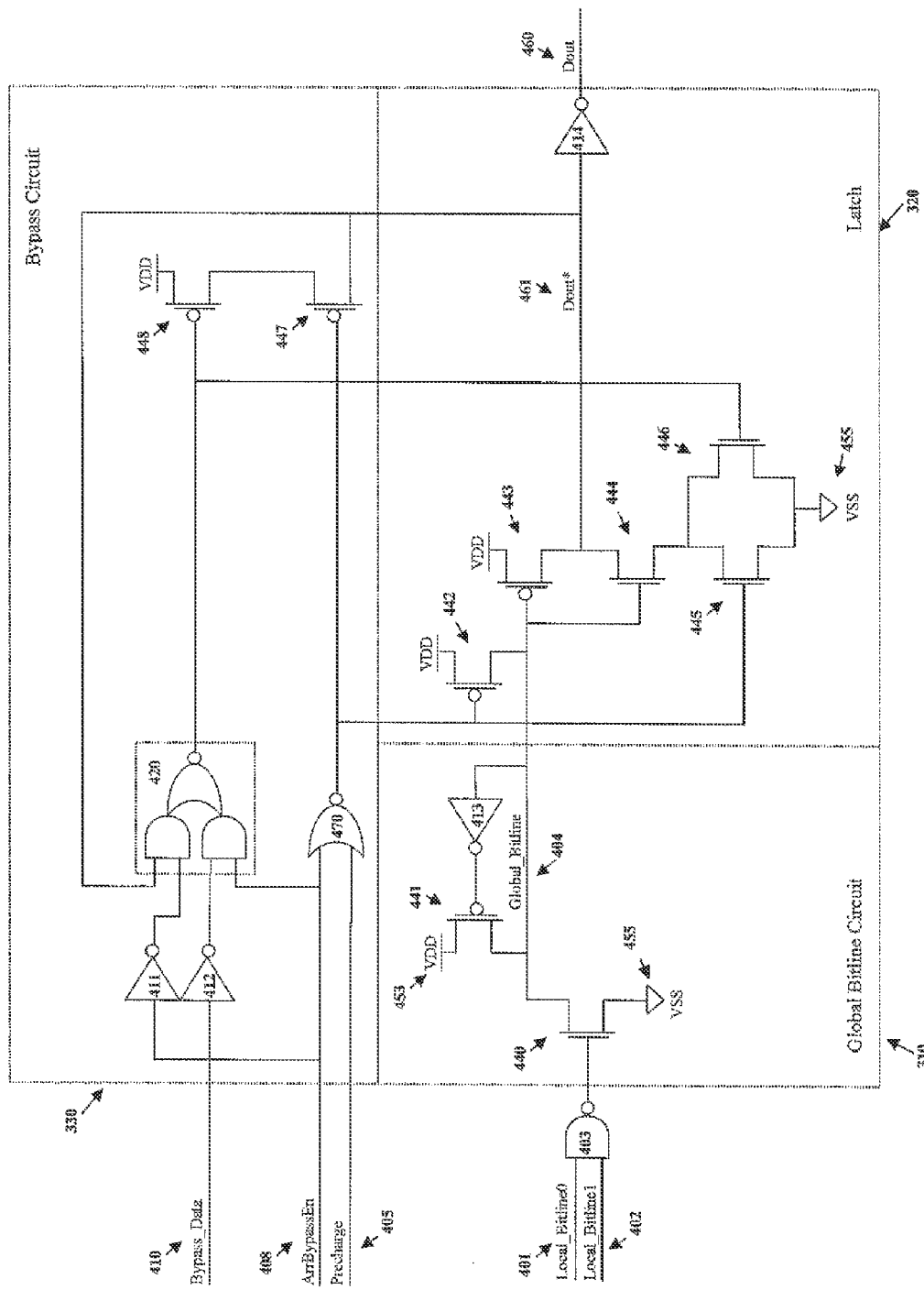
FIG. 5 is a simplified schematic diagram of a typical S-R latch having BIST intrusion logic located in a feedback path via a bypass circuit rather than the functional path in accordance with an exemplary embodiment of the invention.

FIG. 5 illustrates another example of avoiding BIST intrusion logic into the critical timing path of a functional data signal. In FIG. 5, global bitline circuit 310 is coupled to SR latch 320. Bitline circuit 310 may be any bitline circuit of memory array 60, for example. Scan or MBIST test data enters latch 320 as Bypass_Data 410 through bypass circuit 330 and appears as Dout 460 of latch 320, as described in more detail below. In the prior art, Dout 460 of latch 320 would be multiplexed with Bypass_Data 410 on the output side of inverter 414, and the multiplexer that multiplexes Bypass_Data 410 with Dout 460 (not shown) would constitute intrusion logic along the critical path of Dout 460.

In the exemplary embodiment of FIG. 5, the signal path between Global_Bitline 404 and Dout 460 is not encumbered by BIST intrusion logic. During BIST testing, ArrBypassEn 408 is forced high, driving the output of NOR gate 470 low and allowing Bypass_Data 410 to appear on the output of Selector 420. Selector 420 acts as a multiplexer that multiplexes between Dout* 461 and Bypass_Data 410, based on the logic level of ArrBypassEn 408. A logic low on the output of NOR gate 470 closes (turns on) transistor 442, pulling Global_Bitline 403 high. A high on Global_Bitline 403 and a low on NOR gate 470 closes transistors 444 and 447, respectively, and opens (turns off) transistor 445, allowing the bypass data on the output of Selector 420 to determine the state of Dout* 461 by either closing transistor 446 when Bypass_Data 410 is high or transistor 448 when Bypass_Data 410 is low. Inverter 414 inverts Dout* 461 so that Bypass_Data 410 appears with the proper logic level on Dout 460.

When ArrBypassEn 408 is low, Precharge 405 selects which circuit, i.e., the global bitline circuit 310 or bypass circuit 330, determines the logic state of Dout* 461. When Precharge 405 is high, bypass circuit 330 latches the current state of Dout* 461. Specifically, when Precharge 405 is high, the output of NOR gate 470 is driven low, causing Global_Bitline 403 to be driven high through transistor 442 and closing transistor 447 in bypass circuit 330. A high on Global_Bitline 403, in turn, closes transistor 444 and opens transistor 443. Because ArrBypassEn 408 is low during normal operation of microprocessor 10, Dout* 461 controls the output of Selector 420. When Dout* 461 is low, the output of Selector 420 is high, opening transistor 448 and closing transistor 446. Because both transistor 444 and 446 are now closed, Dout* 461 is pulled low, its current state, and remains a logic low. When Dout* 461 is high, the output of Selector 420 is low, turning on transistor 448. In this condition, both transistor 448 and 447 are turned on, which pulls Dout* 461 high. Thus, bypass circuit 330 holds the current state of Dout* 461 during a precharge state.

When Precharge 405 is low, global bitline circuit 310 determines the state of Dout* 461. The output of NOR gate 470 is driven high, turning transistor 445 on and transistors 442 and 447 off. If both Local_Bitline0 401 and Local_Bitline1 402 are high, the output of gate 403 turns transistor 440 off and Global_Bitline 403 is driven high by the action of inverter 413 and transistor 441. When Global_Bitline 403 is high, transistor 443 turns off and transistor 444 turns on. Because transistors 445 and 444 are both on, Dout* 461 is pulled low and Dout 460 assumes a logic high through inverter 414. When either Local_Bitline0 401 or Local_Bitline1 402 is low, transistor 440 turns on and Global_Bitline 403 is pulled low, turning transistor 443 on and transistor 444 off. Because transistor 443 is turned on, Dout* 461 is pulled high and Dout 460 assumes a logic low through inverter 414. The circuit of FIG. 5 allows Dout 460 to be controlled by either Bypass_Data 410 or bitline data 401 and 402 without the bitline data having to propagate through BIST intrusion logic.

Figure 6:
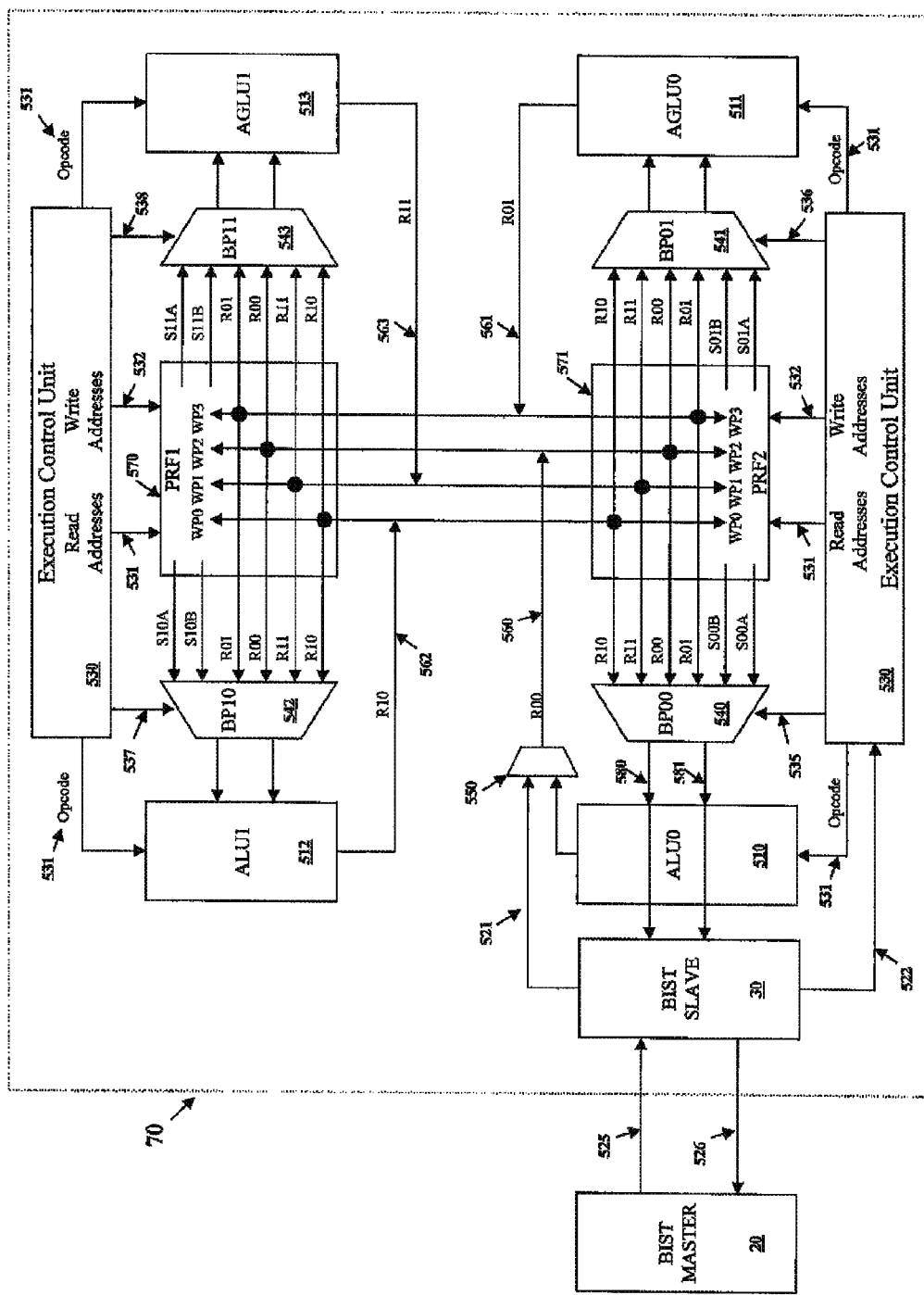
FIG. 6 is a simplified block diagram of an execution unit having at least one multi-cycle ALU with BIST intrusion logic coupled to the result path of the ALU, in accordance with an exemplary embodiment of the invention.

FIG. 6 illustrates yet another example of how to avoid BIST intrusions in the critical timing paths of functional logic. FIG. 6 is a simplified block diagram of an execution unit 70 having two Arithmetic Logic Units (ALU) (510 and 512), two PRFs (570 and 571), and two Address Generation Logic Units (AGLUs) (511 and 513). ALU0 510 is a multi-cycle ALU, while ALU1 512 may be a single- or multi-cycle ALU. Each ALU and AGLU contains a result path (i.e., R00 560, R01 561, R10 562, and R11 563) for writing the results of the respective operations into PRF1 570 and/or PRF2 571. Execution Unit 70 contains execution control unit 530 for generating read and write addresses for PRF1 570 and PRF2 571 during normal microprocessor 10 operation, or BIST operation under the control of BIST Slave 30. Note that execution control unit 530 comprises a single control unit, though it is shown in two places in FIG. 6 to facilitate description. Result path R00 560 contains multiplexer 550 for multiplexing BIST data onto result path R00 560. Execution unit 500 also contains four bypass multiplexers (540, 541, 542, and 543) for multiplexing result path data and source operand data (e.g., S00A and S00B to the respective logic units. BIST Slave unit 30 connects to execution control unit 530 and BIST Master 20 for BIST testing and control and to multiplexer 550 for injecting test patterns into PRF1 570 and PRF2 571. In the prior art, there would be one multiplexer coupled to each result path (i.e., R00 560, R01 561, R10 562, and R11 563) for multiplexing BIST data with result data and for writing the BIST data into each array. Test patterns and control data may be received by BIST Slave 30 from BIST Master 20 either serially or in parallel over 525 or developed internally to BIST Slave 30 in response to control information from BIST Master 20. Test results may be received by BIST Slave 30 through ALU0 510 from Bypass Multiplexer 540, as described in more detail below, and compared internally to expected results or passed on to BIST Master 20 for comparison with expected results and/or further disposition.

BIST slave 30 writes test pattern data into each memory location of each PRF 570 and 571 by outputting BIST write data on R00 560 through multiplexer 550, which may be under the control of BIST Slave 30 or execution unit control 530, and sending control information to execution control unit 530, instructing it, for example, to execute an ADD operation, such as add zero to the BIST write data on R00 560, via ALU1 512. The ADD operation will cause execution control unit 530 to select R00 560 data on bypass multiplexer BP10 542, thereby supplying the BIST write data to ALU1 512, to send the proper opcode 531 to ALU1 512 to execute the ADD operation, and to write result data that would appear on R10 562 back into PRF1 570, for example. As one of skill in the art will understand, BIST Slave 30 and execution control unit 530 may be designed and configured to cause any various types of opcodes 531 to be executed that result in known values being written into either PRF1 570 or PRF2 571. The BIST write data may then be read out of either PRF1 570 or PRF2 571 by, for example, executing a second add operation to, for example, add zero to the previous result and to output the result through bypass multiplexer 540 to BIST Slave 30 through 580 and/or 581 for comparison to expected results in the manner described above. One advantage provided by the exemplary embodiment illustrated in FIG. 6 is allowing testing of an execution unit, including its PRFs, through a single BIST intrusion point, i.e., multiplexer 550. Because the selected result path is a result path of a multi-cycle ALU rather than a single-cycle ALU, the described embodiment does not intrude on a critical timing path.

All elements described herein, including the functional logic 50, functional control 15, execution units 70, memory arrays 60, and scannable sequential elements, may be formed on a semiconductor material by any known means in the art. Forming can be done, for example, by growing or deposition, or by any other means known in the art. Different kinds of hardware descriptive languages (HDL) may be used in the process of designing and manufacturing microcircuit devices. Examples include VHDL and Verilog/Verilog-XL. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in one embodiment, may be used to configure a manufacturing facility (e.g., through the use of mask works) to create devices capable of embodying various aspects of the instant invention. As understood by one or ordinary skill in the art, it may be programmed into a computer, processor or controller, which may then control, in whole or part, the operation of a semiconductor manufacturing facility (or fab) to create semiconductor products and devices. These tools may be used to construct the embodiments of the invention described herein.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. An apparatus comprising:
   a plurality of scan cells connected into one or more scan chains, wherein a scan data input of at least one scan cell is configured to receive built-in test data during BIST testing and scan test data during scan testing;
   at least one execution unit having at least one multi-cycle ALU, at least one single-cycle ALU, at least one physical register file (PRF), and a multiplexer configured to couple test data onto the result path of the multi-cycle ALU and wherein the test data is written into the PRF by executing an operation in one of the ALUs.

2. The apparatus of claim 1, further comprising a memory array having at least one global bitline coupled to functional logic, the functional logic having a functional data input, a functional data output, and a test data input, wherein the test data input is coupled to the functional data output through a bypass circuit, the functional logic configured to cause a signal to propagate from the functional data input to the functional data output without passing through the bypass circuit.

3. The apparatus of claim 2, wherein the bypass circuit comprises a multiplexer having one input coupled to the test data input and another input coupled to a feedback signal representing the functional data output.

4. A non-transitory computer readable storage device encoded with data that, when implemented in a manufacturing facility, adapts the manufacturing facility to create an apparatus, comprising:
   a plurality of scan cells connected into one or more scan chains, wherein a scan data input of at least one scan cell is configured to receive built-in test data during BIST testing and scan test data during scan testing; and
   at least one execution unit having at least one multi-cycle ALU, at least one single-cycle ALU, at least one physical register file (PRF), and a multiplexer configured to couple test data onto the result path of the multi-cycle ALU and wherein the test data is written into the PRF by executing an operation in one of the ALUs.

5. The non-transitory computer readable storage device of claim 4, further comprising a memory array having at least one global bitline coupled to functional logic, the functional logic having a functional data input, a functional data output, and a test data input, wherein the test data input is coupled to the functional data output through a bypass circuit, the functional logic configured to cause a signal to propagate from the functional data input to the functional data output without passing through the bypass circuit.

6. The non-transitory computer readable storage device of claim 4, wherein the bypass circuit comprises a multiplexer having one input coupled to the test data input and another input coupled to a feedback signal representing the functional data output.

7. A method of manufacturing a microcircuit to avoid built-in self-test (BIST) intrusion logic in critical timing paths thereof, comprising:
  forming on a semiconductor material a multiplexer configured to provide BIST data or scan test data to a scan data input circuit of a scan cell; and
  forming on the semiconductor material an execution unit having at least one single-cycle ALU, at least one multi-cycle ALU, at least one PRF, and a multiplexer configured to place a test pattern on the result path of the multi-cycle ALU, and wherein the execution unit is configured to execute an operation that results in the test pattern being written into the PRF.

8. The method of claim 7, further comprising forming on the semiconductor material a bypass circuit and functional logic, the functional logic having a functional data input and a functional data output, the bypass circuit having a test data input, wherein the test data input is coupled to the functional data output through the bypass circuit and the functional logic is configured to allow a signal on the functional data input to propagate to the functional data output without passing through logic comprising the bypass circuit.

9. The method of claim 8, wherein the bypass circuit comprises a multiplexer having one input coupled to the test data input and another input coupled to a feedback signal representing the functional data output.

10. The method of claim 8, wherein the execution unit is further configured to read the test pattern out of the PRF by executing another operation and to supply the test pattern to test logic for comparison.

11. The method of claim 10, wherein the execution unit has at least two PRFs and is configured to write the test pattern into either of the PRFs.

* * * * *